Figure 1:
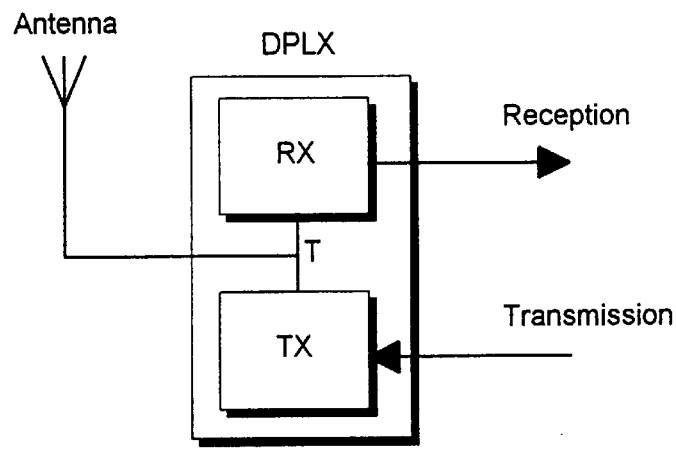

United States Patent [19]
Yrjölä et al.

[11] Patent Number: 6,023,608
[45] Date of Patent: Feb. 8, 2000

[54] INTEGRATED FILTER CONSTRUCTION

[75] Inventors: Seppo Yrjölä; Kimmo Koskiniemi, both of Oulu, Finland

[73] Assignee: LK-Products OY, Kempele, Finland

[21] Appl. No.: 08/845,561

[22] Filed: Apr. 24, 1997

[30] Foreign Application Priority Data

Apr. 26, 1996 [FI] Finland ................................ 961799

[51] Int. Cl.[7] ........................................ H04B 1/44
[52] U.S. Cl. .................. 455/78; 455/80; 333/81 A; 333/204
[58] Field of Search .................. 455/306, 307, 455/316, 317, 318, 114, 299, 285, 286, 78, 80, 82; 333/12, 13, 1 R, 1 A, 146, 219, 204

[56] References Cited

U.S. PATENT DOCUMENTS

| | | | |
|---|---|---|---|
| 3,728,731 | 4/1973 | Choi et al. ................................ | 343/180 |
| 5,055,809 | 10/1991 | Sagawa et al. .......................... | 333/219 |
| 5,153,542 | 10/1992 | Tai et al. ................................. | 333/204 |
| 5,212,815 | 5/1993 | Schumacher ............................ | 455/126 |
| 5,255,318 | 10/1993 | Gurusami et al. ...................... | 455/26.1 |
| 5,374,906 | 12/1994 | Noguchi et al. ......................... | 333/134 |
| 5,721,520 | 2/1998 | McVeety et al. ........................ | 333/202 |

FOREIGN PATENT DOCUMENTS

| | | | |
|---|---|---|---|
| 0346672 | 12/1989 | European Pat. Off. | ........ H01P 1/205 |
| 0373452 | 6/1990 | European Pat. Off. | ........ H01P 1/212 |
| 0506340 | 9/1992 | European Pat. Off. | ........ H01P 1/205 |
| 0638953 | 2/1995 | European Pat. Off. | ........ H01P 1/203 |

*Primary Examiner*—Thanh Cong Le
*Attorney, Agent, or Firm*—Darby & Darby

[57] ABSTRACT

A harmonic filter is added to a radio frequency filter comprising at least one transmission line resonator (R1; R2; R3) to filter harmonic multiples of the filter's operating frequency. Coupling to the harmonic filter occurs through matching couplings and transmission lines (7; L1 to L9; L20; L28) in the filter or via the electromagnetic field of said transmission line resonator (R1; R2; R3). The harmonic filter advantageously comprises striplines (L13 to L19; L21 to L27; L29 to L49) manufactured in conjunction with the other stripline structures in the filter.

10 Claims, 11 Drawing Sheets

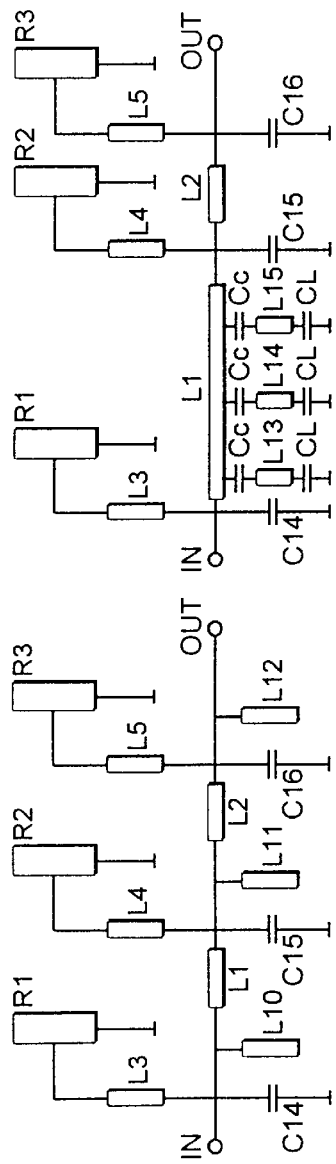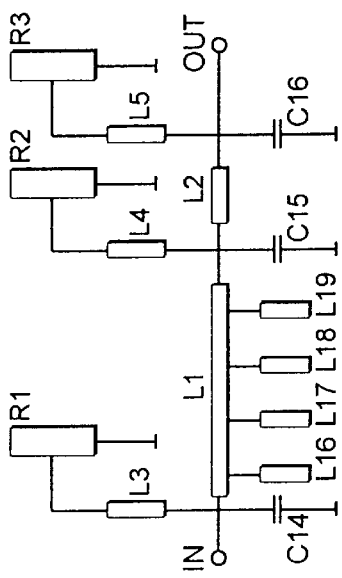
Fig. 6a
Fig. 6b
Fig. 6c

INTEGRATED FILTER CONSTRUCTION

The invention relates to a radio frequency filter construction wherein a harmonic filter and a transmission line resonator filter are combined.

The trend in the radio communications industry has for long been towards ever smaller, cheaper and more efficient devices and components. This development has led to a high degree of utilization of printed circuit board surface area as well as to a radical increase in the level of component integration. High-frequency parts in radio telephones are an exception to this rule as they have so far largely been constructed using separate components and strip structures.

A duplex filter, which separates the received and transmitted signals from each other, is one of the most important components in modern radio telephones as regards both the electrical characteristics and physical dimensions. Since this unit is the biggest RF component in the device, whether measured by volume or by mass, it is desirable to reduce its size, surface area and mass so that mobile telephones and other such devices can be made smaller. Power losses in the duplex filter should be as small as possible to prevent the energy charge in the battery of a telephone from being wasted during operation.

In analog radio telephones according to the prior art, and more generally in full duplex systems using one and the same antenna for transmission and reception, it is common to use duplex filters based on resonators and comprising two separating filters to separate the transmitted and received signals from each other. A duplex filter prevents the transmitted signal from entering the receiver and the received signal from entering the transmitter. In digital mobile telephone systems, such as the global system for mobile telecommunications (GSM), based on half duplex and time division multiple access (TDMA), the transmission and reception are performed in different time slots and at different frequencies. In digital systems, the requirements for the duplex filter need not be as strict as normally in analog telephones and therefore digital radio communication devices can use smaller duplex filters than corresponding analog devices.

A duplex filter, or duplexer, is a three-port circuit element comprising a transmitter filter and receiver filter and a matching network to match the filters to a common antenna port. A prior art arrangement according to FIG. 1 includes a duplex filter DPLX that comprises a transmitter filter TX and receiver filter RX. The filters and their matching network T are so arranged that on the receive frequency band the transmitter filter TX shows a very high impedance to the antenna and the receiver filter RX shows the impedance of the antenna to the antenna, ie. it is matched to it. Correspondingly, on the transmit frequency band the receiver filter RX shows a very high impedance to the antenna and the transmitter filter TX is matched to the antenna impedance. The requirement for the stop-band attenuation, ie. the minimum requirement for signal attenuation on a direct route from transmitter to receiver is in a modern digital mobile phone about 30 dB.

The task of the transmitter filter TX is to attenuate, in the signal traveling through it toward the antenna, all spurious signals external to the transmission band, such as harmonics of the transmit frequency, other distortion products and oscillator leak signals. In addition, it is often necessary to filter out noise generated by the transmitter chain when its frequency coincides with the receiver's frequency band. All filter types cause insertion loss which appears as power losses and produces a load on the amplifier stages and batteries and shortens the talk time. It is known that the insertion loss of a band rejection filter (BRF) is smaller than that of a band pass filter (BPF) with corresponding stopband attenuation characteristics, and therefore, in a modern mobile phone, the transmitter filter (TX) in the duplex filter is typically of the band rejection type.

The main task of the receiver filter (RX) in the duplex filter is to protect the sensitive amplifiers in the receiver against the high-power transmission signal and to discriminate the desired frequency from the signal coming via the antenna and to attenuate spurious signals external to the receive band. If there is not enough attenuation at the transmit frequency in the receiver filter RX, the receiver branch of the radio device may become blocked. Blocking occurs if the transmitted signal leaks out or is reflected from the antenna to the receive side RX and results in the overcontrol of the receiver amplifier (not shown). Any local oscillator, such as the transmitter synthesizer (not shown) generates noise that can get past the mixer (not shown) in the receive circuits to the received signal frequency. Oscillator signal leakage and mixing with the radio-frequency signal produces spurious signals which are attenuated by the receiver filter RX. The receiver filter with attenuation requirements on both sides of the receiving frequency band is typically realized as a band pass type filter.

The filters can be various types of constructions based on different kinds of resonators. Mobile phones often use filters based on cylindrical coil conductor, or helix, resonators or dielectric ceramic resonators. It is also possible to use stripline filters and surface acoustic wave (SAW) filters. It is obvious to a person skilled in the art that other types of filters can be used as well.

Figure 2:
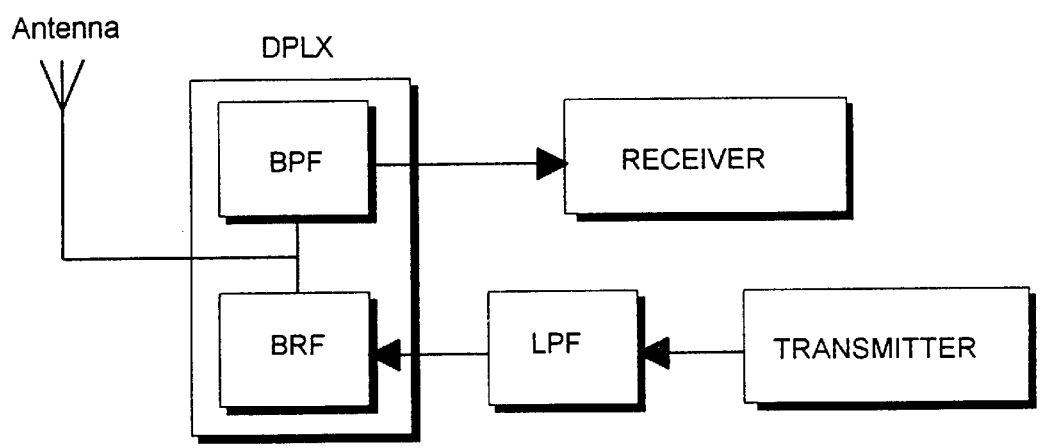

Another well-known circuit in the transmitter branch of a radio telephone, in addition to the transmitter branch filter TX, is a harmonic frequency filter, or harmonic filter, which reduces the amount of energy connected to the antenna at the harmonic frequencies of the transmitted signal. FIG. 2 shows in block diagram format a known transmitter and receiver branch construction having a duplex filter DPLX and a separate low pass type harmonic filter LPF. It is obvious to one skilled in the art that the harmonic filter LPF shown in the arrangement of FIG. 2 is not restricted to be used only in conjunction with a duplex filter but it can be applied in other filter constructions, too.

In a system where the transmitter is connected to an antenna of it, own the harmonic filter may be relatively simple. If the transmitter shares an antenna with another device such as a receiver, as shown in FIG. 2, the harmonic filter LPF is usually considerably more complex. It may be e.g. a band pass filter which passes through only a relatively narrow frequency band, ie. the transmitter's operating frequency, or a low pass filter. Such a solution is typical in the hand held phones of modern radio telephone systems, for example.

The filters typically employ different transmission line resonator structures, such as coaxial, helix and ceramic resonators to achieve the smallest possible insertion loss with a filter as small as possible. As is known, the filtering characteristics of such transmission line resonator structures are limited at the harmonic multiples of the pass band and therefore filter designers have been forced to place a separate harmonic filter in series with a resonator-type band pass filter. This increases the number of components, increases the printed circuit board area required by filtering, increases the insertion loss and increases manufacturing costs.

Figure 3:
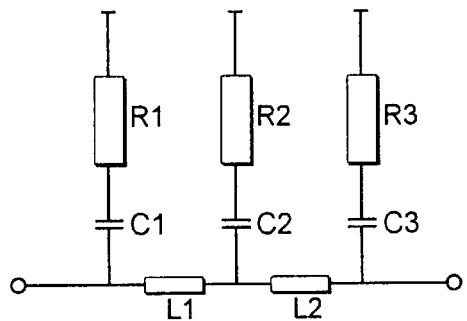
Figure 4A:
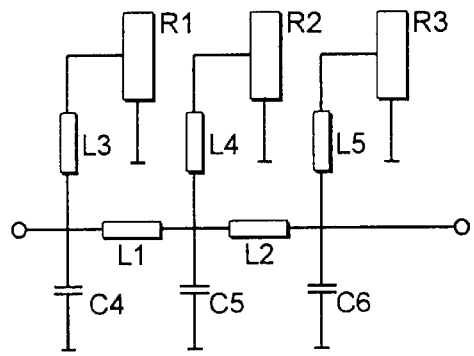
Figure 4B:
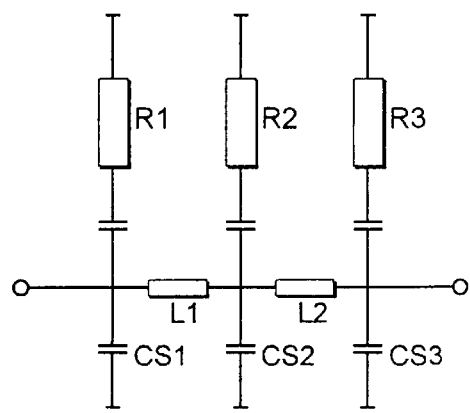

In duplex filters of radio devices and especially mobile telephones according to the prior art it is known to make the internal circuits and matching networks such that they have, in addition to the characteristics optimized for the operating frequency, some low pass type harmonic attenuation effect. FIG. 3 illustrates an equivalent circuit of a conventional band rejection type transmission line resonator filter, in which quarter-wavelength transmission line resonators R1–R3 and series capacitances C1–C3 act as series resonant circuits, and transmission lines L1 and L2 as 90-degree phase shifters between said resonant circuits. FIG. 4a shows an equivalent circuit of a filter with the same operating principle, implemented using helix resonator technology, and FIG. 4b illustrates a known method for replacing said 90-degree phase shifters with circuits comprising capacitors CS1–CS3 and transmission lines L1 and L2. The filter construction of FIG. 3 and its variations shown in FIGS. 4a and 4b have two functional purposes: band rejection and low pass filtering. Thus, the design of a low pass filter is returned to the design of a proportional integrator (PI) type LC filter, ie. a filter comprising capacitive and inductive components, implemented with lumped circuit constants.

A problem with the construction described above is that components L1, L2, C4–C6, CS1–CS3 of the low pass construction used for harmonic filtering act as parts of both a low pass and a band rejection filter. The component value requirements set by these functions are not always identical but improving the low pass characteristics generally impairs the band rejection characteristics and vice versa. This results in continuous comprimises between the design of the actual transmission line resonator filter and the design of the low pass filter directed against the harmonic multiples of the transmission frequency band, which usually undermines the performance of the construction. Furthermore, in digital mobile telephone systems based on half duplex and time division multiple access (TDMA) systems where the stopband attenuation requirements for the filters have become less strict, the number of transmission line resonators required has been reduced to 2 to 3 from the 4 to 5 in analog filters. The decrease in the number of resonators has at the same time reduced the number of low pass stages realized using phase shifters between them, which means the number of degrees in harmonic filters has; been reduced, which has led to the need for finding other methods for improving the filtering of harmonic frequencies.

Figure 5A:
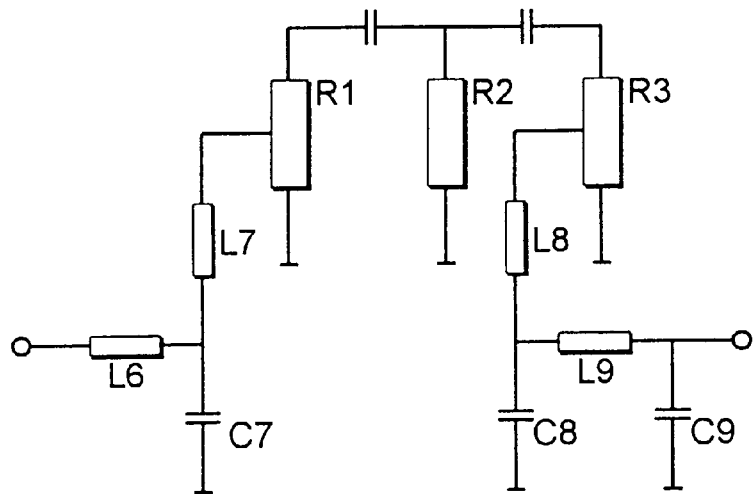

Next it will be considered solutions according to the prior art to combine a harmonic filter with a band pass filter. Since the band pass construction (BPF) typically does not include the 90-degree phase shifters described above in conjunction with the band rejection filter, into which a low pass type harmonic filter (LPF) could be integrated, it is much more difficult to design harmonic attenuation in the BPF construction. In addition to the use of a separate harmonic filter (such as the LPF in FIG. 2) a known method is to make the matching circuits of the filter input and/or output port such that in addition to the matching characteristics optimized for the operating frequency they also have some harmonic attenuation effect. Typically, this requires extra components, increases insertion loss and increases manufacturing costs. FIG. 5a shows an equivalent circuit of a typical band pass filter implemented using transmission line resonators, wherein the matching circuits of the input and output resonators R1 and R3 are of the low pass type so as to attenuate harmonic frequencies. The inductances of transmission lines L6 and L9 as well as the transverse capacitances C7, C8 and C9 serve as LC resonant circuits to produce low pass characteristics at harmonic frequencies.

As with a band rejection filter, the problem is that components L6, L9, C7–C9 of the low pass construction act as parts of two different filters the component value requirements of which obviously do not always agree. The design of such a construction also requires compromises between the transmission line resonator filter design and the low pass filter LPF design, which impairs the performance of the construction. Solutions according to the prior art require separate components such as capacitors and coils to achieve harmonic filtering.

An object of this invention is to provide a combined duplex filter and harmonic filter construction especially suited for mobile telephone systems;, which partly eliminates and partly reduces the aforementioned problems related to the constructions of separate and integrated harmonic and transmission line resonator filters. Another object of the invention is to enhance the attenuation of harmonics, as compared to the solutions described above.

The objects of the invention are achieved by connecting to the transmission line resonator filter a separate harmonic filter part, coupling to which is made via matching and coupling structures in the transmission line resonator filter or through the electric and/or magnetic field of at least one resonator.

The radio frequency filter according to the invention is characterized in that it includes attenuation circuits to attenuate the harmonics of its operating frequency and coupling to said attenuation circuits is made via matching circuits between the transmission line resonators and ports or via matching circuits between the transmission line resonators or via the electromagnetic field of the transmission line resonators.

In transmission line resonator filters, the couplings to and between the resonators are traditionally implemented with matching circuits comprising various transmission line constructions and separate components. The invention is based on an idea to utilize said transmission line constructions in the coupling to the harmonic attenuation filter. In the filter arrangement according to the invention, the harmonic filter construction comprises the filter transmission line construction and the harmonic attenuation filter connected to it without the long transmission lines and matching components required by the conventional separate harmonic filter, wherefore additional losses at the operating frequency of the transmission line resonator filter are minimal, which is a considerable improvement to the prior art. Furthermore, designing an integrated filter becomes easier as the harmonic attenuation filters can be designed and optimized to a large extent separately from the actual transmission line resonator filter. They can be freely designed such that they attenuate in an optimal manner the harmonic frequency, because they do not significantly affect the operation of the duplex filter at the fundamental frequency.

In a way, the invention corresponds to moving a conventional separate harmonic filter from a mobile phone's main board, which suffers from environmental interference and often has big losses, inside a high-frequency filter where the conditions are advantageous: encapsulated environment shielded against interference and a low-loss and stable substrate essential in filter technology. Compared to a conventional separate harmonic filter there is the significant difference that the harmonic filter according to the invention may include several filtering stages placed in different locations in the transmission line resonator filter, whereby the parts of the transmission line resonator filter that are located between the filtering stages of the harmonic filter implement phase shifts useful for harmonic filtering and serve as transmission lines between the harmonic filtering stages.

From the point of view of the invention it is irrelevant what kind of resonators the transmission line resonator filter includes High-power and high-frequency applications advantageously employ filters comprising cylindrical coil conductors, or helixes, or transmission line resonators in a dielectric block. It is obvious to one skilled in the art that other types of filters, such as coaxial and stripline resonator filters, can be used as well. As was stated above, the transmitter-to-receiver stop-band attenuation requirement for a digital mobile phone is about 30 dB. In an analog phone the stop-band attenuation requirement is typically about 60 dB.

A harmonic attenuation filter can be realized in many different ways using circuit elements known to a person skilled in the art, such as striplines and their combinations, wherein coupling from one circuit element to another may occur galvanically or through an electromagnetic field, and separate capacitors, coils and resistors. Said separate components are advantageously surface mounted components. From the point of view of the invention the technical implementation of the harmonic attenuation filter is irrelevant and the essential thing is that the harmonic attenuation filter is included in the filter and coupling to it is made through structures already existing in the filter. Like a duplex filter, the filter may comprise two filters, e.g. an RX or TX discrimination filter, or it may be a separate filter like a band pass filter (BPF).

Figure 5B:
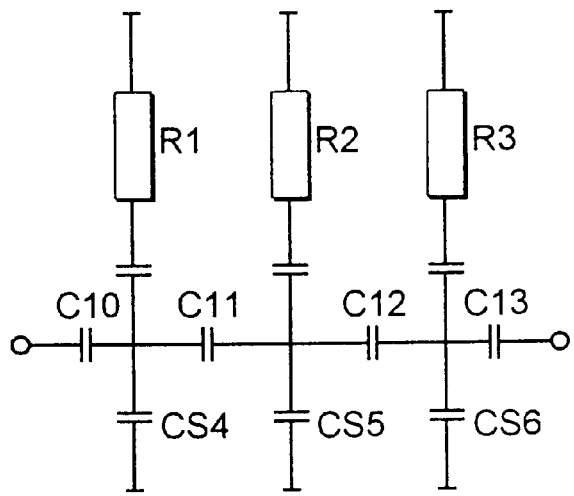
Figure 7A:
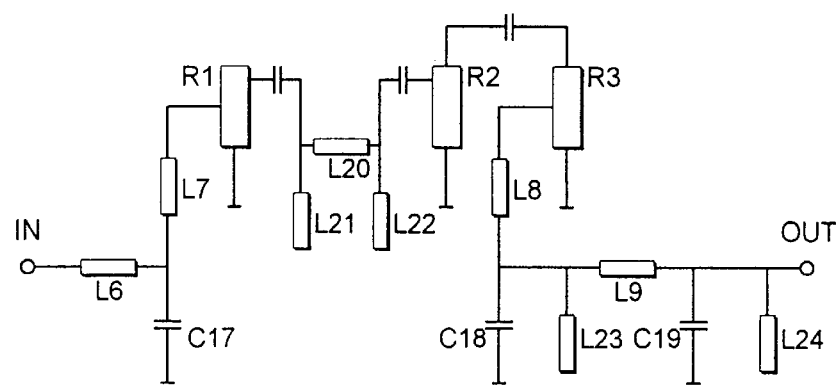
Figure 7B:
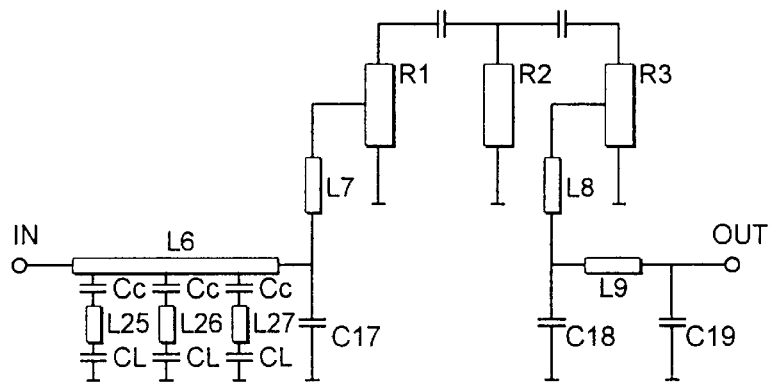
Figure 7C:
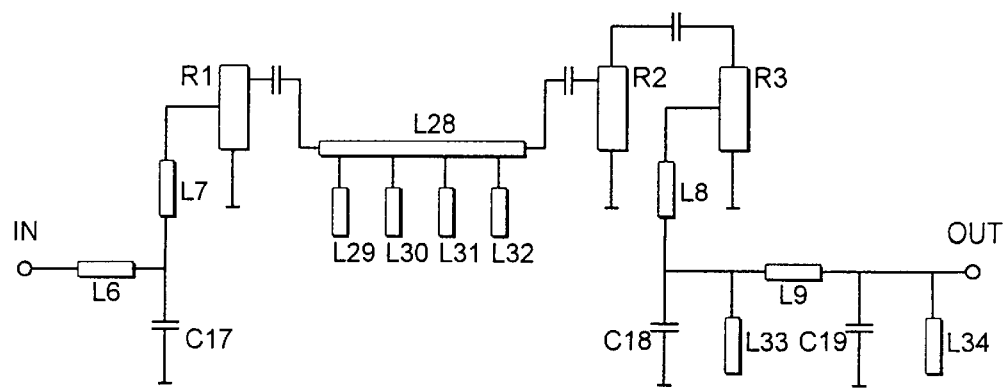
Figure 8A:
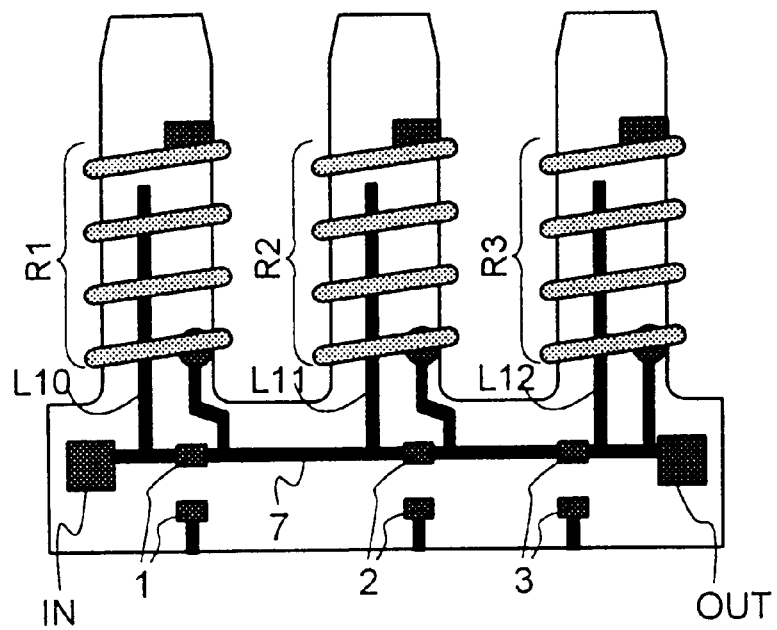
Figure 8B:
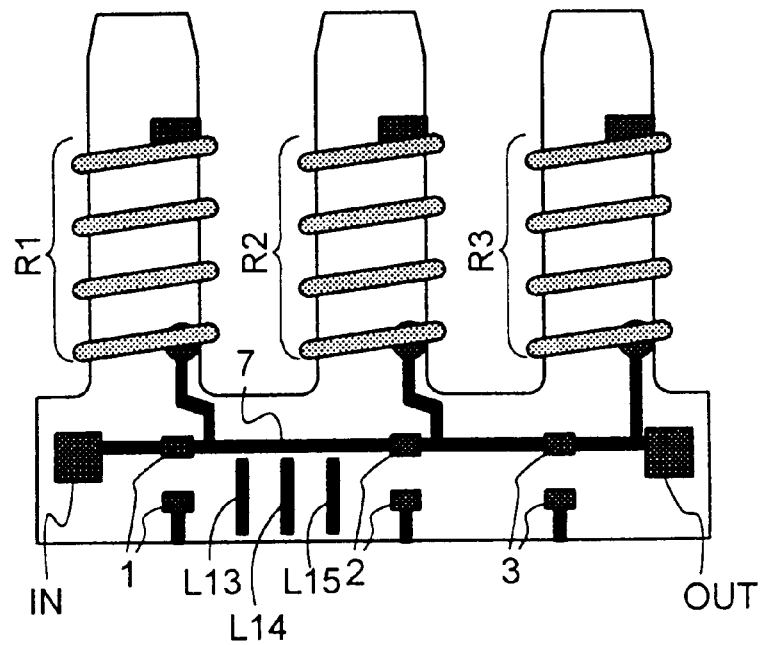
Figure 8C:
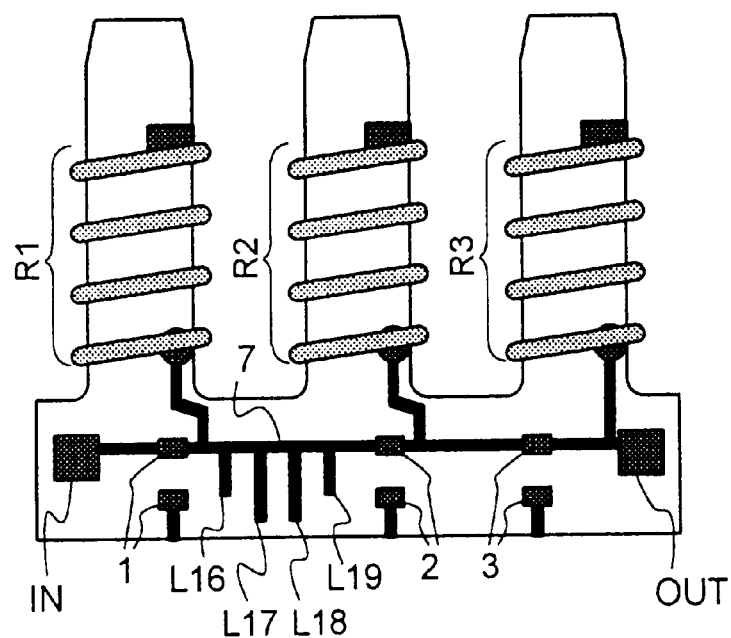
Figure 8D:
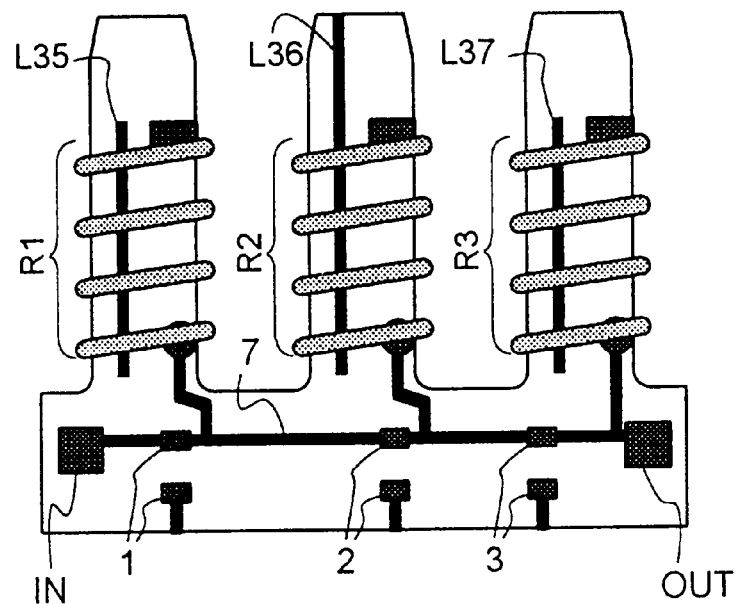
Figure 8E:
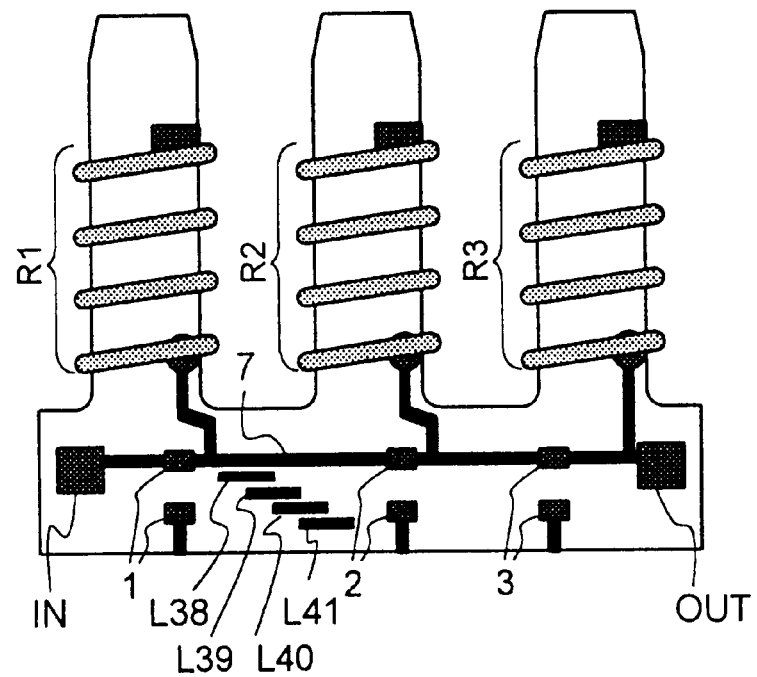
Figure 8F:
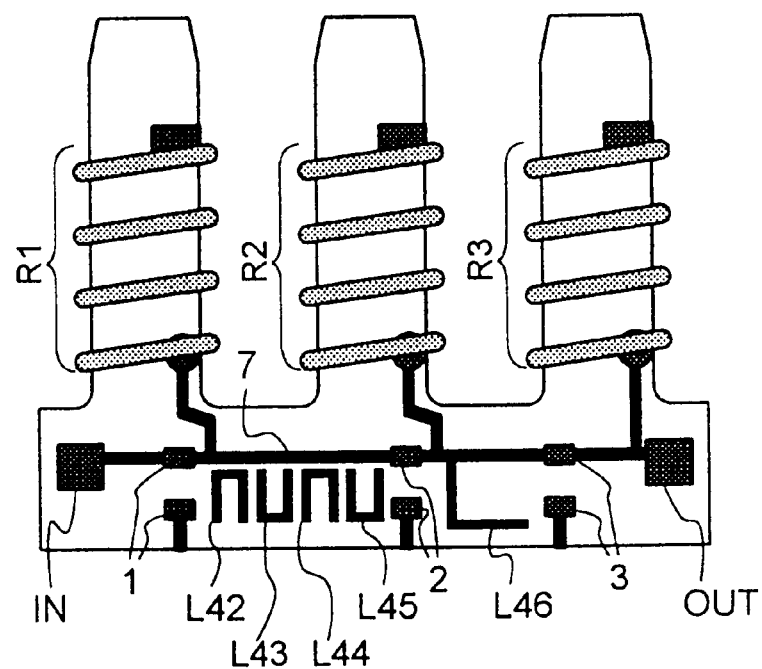
Figure 9:
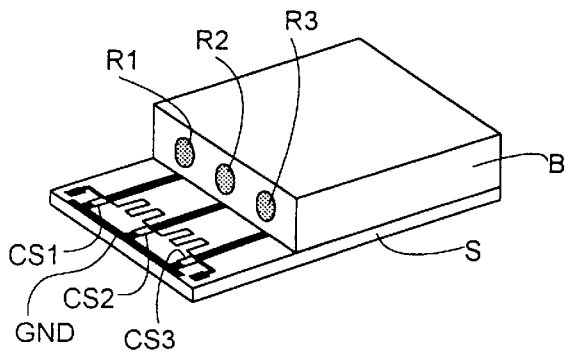
Figure 10A:
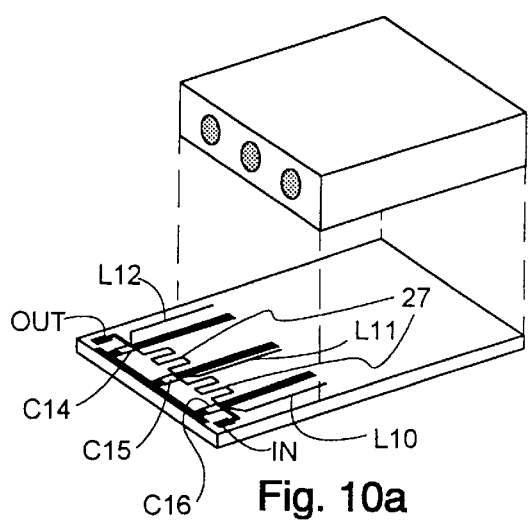
Figure 10B:
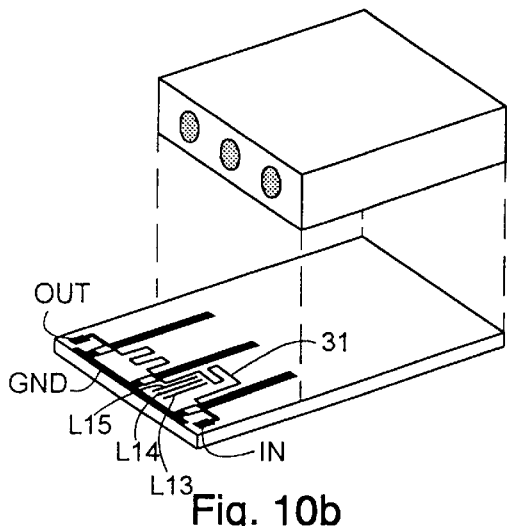
Figure 10C:
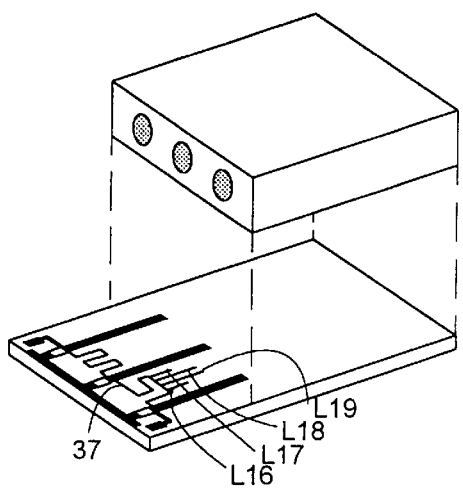
Figure 10D:
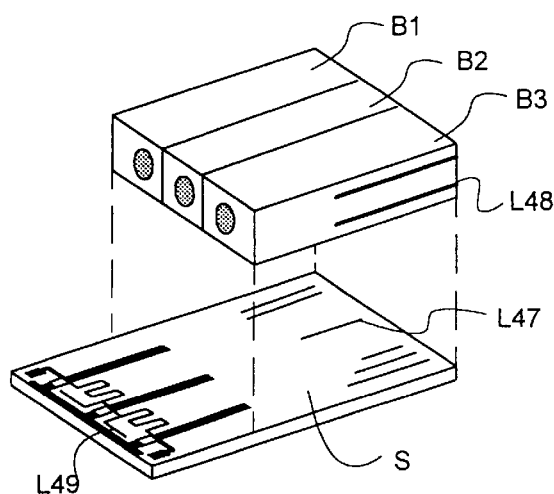
Figure 11A:
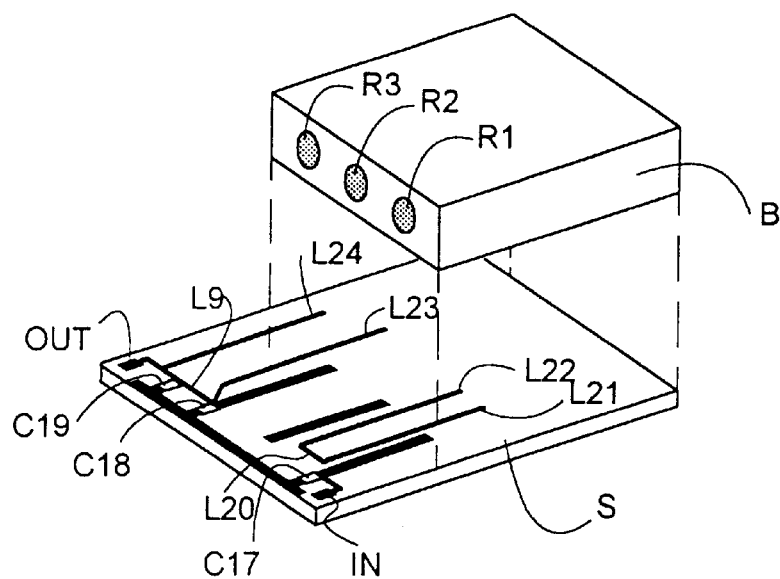
Figure 11B:
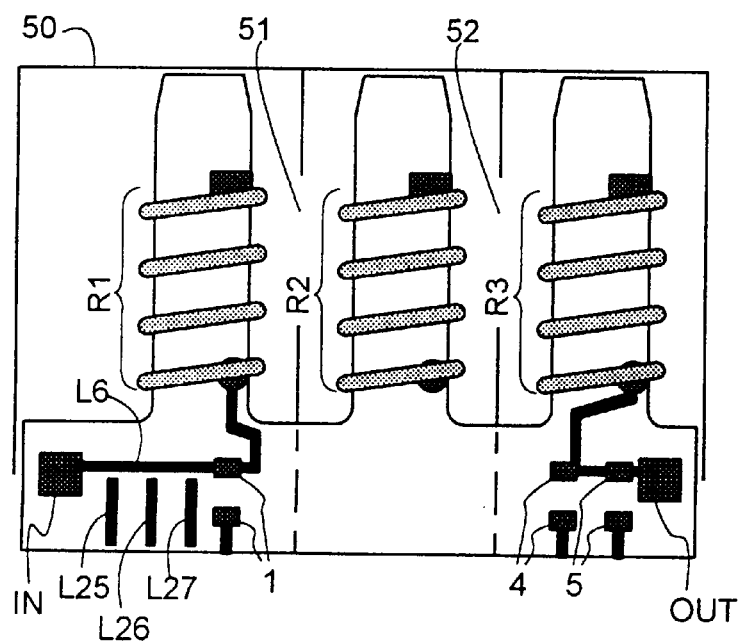
Figure 11C:
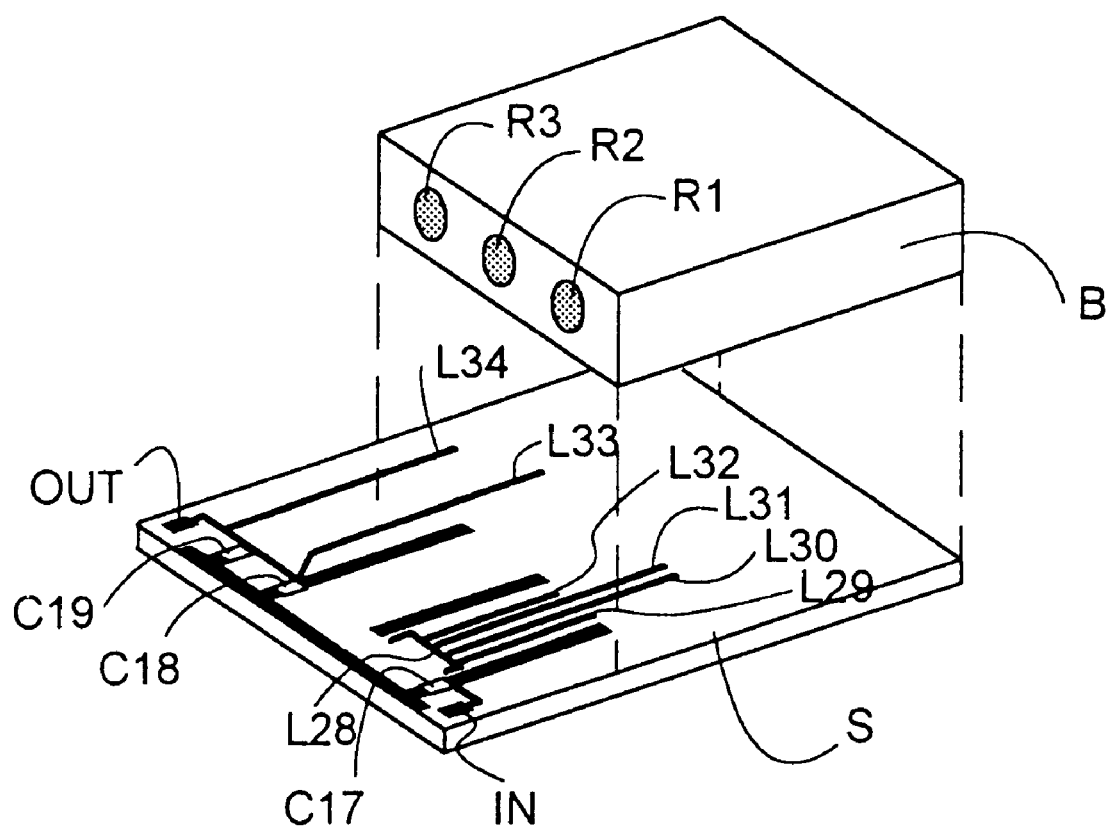

The invention is described in more detail with reference to the accompanying drawing, in which FIG. 1 illustrates the construction of a known duplex filter and the coupling of the TX and RX branches to a common antenna, FIG. 2 illustrates a known block level construction of a duplex filter and harmonic attenuation filter and its use in a radio telephone, FIG. 3 shows an equivalent circuit of a known band rejection filter implemented with transmission line resonator technology, FIG. 4a shows an equivalent circuit of a known band rejection filter implemented with transmission line resonator technology, wherein phase shifters are also used as a low pass type harmonic attenuation filter, FIG. 4b shows a known equivalent circuit of a second embodiment of the filter arrangement shown in FIG. 4a, FIG. 5a shows an equivalent circuit of a known band pass filter implemented with transmission line resonator technology, wherein the matching structures of the input and output circuits are also used as low pass type harmonic attenuation filters, FIG. 5b shows a known equivalent circuit of a second embodiment of the filter arrangement shown in FIG. 5a, FIG. 6a shows an equivalent circuit of the filter arrangement according to the invention, wherein a harmonic attenuation filter is included in a band rejection filter implemented with transmission line resonator technology, FIG. 6b shows an equivalent circuit according to the invention of a second embodiment of the filter arrangement shown in FIG. 6a;

FIG. 6c shows an equivalent circuit according to the invention of a third embodiment of the filter arrangement shown in FIG. 6a, FIG. 7a shows an equivalent circuit of the filter arrangement according to the invention, wherein a harmonic attenuation filter is included in a band pass filter implemented with transmission line resonator technology, FIG. 7b shows an equivalent circuit according to the invention of a second embodiment of the filter arrangement shown in FIG. 7a, FIG. 7c shows an equivalent circuit according to the invention of a third embodiment of the filter arrangement shown in FIG. 7a, FIG. 8a illustrates the implementation according to the invention of the circuit diagram in FIG. 6a in a helix filter, FIG. 8b illustrates the implementation according to the invention of the circuit diagram in FIG. 6b in a helix filter, FIG. 8c illustrates the implementation according to the invention of the circuit diagram in FIG. 6c in a helix filter, FIG. 8d shows a fourth embodiment of the harmonic attenuation filter according to the invention in a helix filter, FIG. 8e shows a fifth embodiment of the harmonic attenuation filter according to the invention in a helix filter, FIG. 8f shows a sixth embodiment of the harmonic attenuation filter according to the invention in a helix filter, FIG. 9 shows a known implementation of the circuit diagram in FIG. 4b in a ceramic filter, FIG. 10a shows the implementation according to the invention of the circuit diagram in FIG. 6a in a ceramic filter, FIG. 10b shows the implementation according to the invention of the circuit diagram in FIG. 6b in a ceramic filter, FIG. 10c shows the implementation according to the invention of the circuit diagram in FIG. 6c in a ceramic filter, FIG. 10d shows a fourth embodiment of the harmonic attenuation filter according to the invention in a ceramic filter, FIG. 11a shows the implementation according to the invention of the circuit diagram in FIG. 7a in a ceramic filter, FIG. 11b shows the implementation according to the invention of the circuit diagram in FIG. 7b in a helix filter, and FIG. 11c shows the implementation according to the invention of the circuit diagram in FIG. 7c in a ceramic filter.

FIGS. 1 to 5b were explained above in conjunction with the description of the prior art, so below in the description of the invention we will mainly refer to FIGS. 6a to 11c. In all pictures, like parts are designated with like reference numbers. First we will describe the equivalent circuits in FIGS. 6a to 6c and their embodiments shown in FIGS. 8a to 10d.

FIG. 6a shows an equivalent circuit of the filter arrangement according to the invention and FIG. 8a its implementation in a helix filter. Helix resonators R1, R2 and R3 in the filter can be realized according to FIG. 8a as a so-called finger support construction (or as a comb structure) which is disclosed e.g. in the Finnish Patent No. 80542. In that construction, the resonators are metal wires wound as a cylindrical coil around a projection on the insulating plate. An electrical circuit is produced at the lower part of the insulating plate using separate components, advantageously surface mounted components, and striplines. It is simple to add to the insulating plate the strip structures L10, L11 and L12 required by the harmonic attenuation filter, thereby achieving a compact integrated construction comprising a transmission line resonator filter (here, a helix filter) and a harmonic attenuation filter according to the invention. Capacitors C14, C15 and C16 off FIG. 6a are not shown in FIG. 8a but they are added to the filter of FIG. 8a as surface mounted components soldered to coupling pads 1, 2 and 3.

Transmission lines L1 to L5 of FIG. 6a are not separately shown in FIG. 8a but they are included in the stripline structure 7 between the resonators. Transmission lines L10, L11 and L12 implemented using stripline technology are open, quarter-wave-long transmission line sections, or stubs. The strip structure consists of suspended substrate lines, which means the conductors are formed on the surface of the insulating plate and a ground plane is provided by the filter casing (not shown) made of an electrically conductive material. Since the transmission lines are open circuits at a harmonic of the fundamental frequency, say, at the third multiple frequency, their combined effect attenuates the harmonic of the fundamental frequency. Connection of stubs L10, L11 and L12 to a common transmission line resonator filter strip 7 produces between the filter input port IN and output port OUT a great attenuation at the desired harmonic and a small insertion loss at the fundamental frequency. In addition to the harmonics, also other undesired frequencies can be chosen to be attenuated by making the stripline stubs varying in length and by connecting them to different locations of stripline 7. Filter constructions operating at different frequencies can be integrated to different transmission line constructions of the transmission line resonator filter to attenuate several different harmonics and spurious frequencies. From the point of view of the invention it is not essential that striplines L10, L11 and L12 be located inside helix resonators R1, R2 and R3, but they will be positioned into a suitable free space on the insulating plate.

FIG. 8b illustrates the realization of the circuit in FIG. 6b in a helix filter. The helix resonator filter is implemented in the same way as in FIG. 8a. The harmonic attenuation filter is implemented with stripline stubs L13, L14 and L15 which are at their upper end capacitively coupled through a gap to stripline 7 in the helix resonator filter. At the lower end, the stubs are capacitively coupled through a gap to a ground plane (not shown) at the bottom of the insulating plate, thereby making possible to reduce the mechanical length of the stubs. Stubs L13, L14 and L15 and the corresponding section of stripline 7 constitute a known π-type low pass construction which can be used to attenuate undesired frequencies above a certain threshold frequency.

FIG. 8c illustrates the realization of the circuit in FIG. 6c in a helix filter. The helix resonator filter is implemented in the same way as in FIG. 8a. The harmonic attenuation filter is implemented using stripline stubs L16, L17, L18 and L19 which are at their upper end coupled to stripline 7 included in the helix resonator filter. At the lower end the stubs are open, thereby constituting quarter-wave transmission line resonators. The construction comprising stubs L16, L17, L18 and L19 can be used to attenuate undesired frequencies in the same way as the construction comprising stubs L10, L11 and L12 shown in FIG. 8a.

FIG. 8d shows, integrated in a helix resonator filter according to FIG. 8a, three stripline resonators L35, L36 and L37 the lengths of which equal half or quarter of the wavelength of a harmonic. Each of the stripline resonators is coupled to the corresponding helix resonator R1, R2 or R3 through an electric field magnetic field, which means no galvanic contact to the helix resonator filter striplines is needed and, therefore, stripline resonators L35, L36 and L37 can be formed on the back side of the insulating plate as well. The resonators formed by the striplines can have their both ends shorted, their both ends open, like striplines L35 and L37 in the picture, or one end shorted and the other end open, like stripline L36, shown in the picture, the upper end of which reaches the top edge of the insulating plate and is in contact with the filter casing (not shown) made of an electrically conductive material.

FIGS. 8e and 8f show other known harmonic attenuation filter constructions L38 to L46 which are applicable according to the invention and which are used in separate low pass filters. It is obvious to a person skilled in the art that other types of filter constructions can be made part of a transmission line resonator filter according to the invention, and the invention is in no way limited to the embodiments illustrated in FIGS. 8a to 8f.

Next it will be considered the realization of the harmonic filter according to the invention in a dielectric filter. To illustrate the basic concepts of a dielectric filter FIG. 9 schematically shows a known implementation of the circuit diagram shown in FIG. 4b as a dielectric filter comprising a block B made of a dielectric material wherein resonators R1 to R3 are holes extending through the block and coated with a conductive material, as well as a substrate S onto which the necessary conductive patterns are formed using photolithography. The substrate S may be a ceramic substrate, teflon substrate or a printed circuit board of another material. The circuit arrangement shown in FIG. 9 is not fully identical with FIG. 4b but it shows the implementation in general outline. The dielectric block B is for the greater part coated with a conductive material except for the block surface toward which the so-called open high-impedance ends of the resonators open and the surface that faces the substrate S. The surface that contains the high-impedance ends of the resonators is shown as the surface containing resonator holes R1, R2 and R3. The lower ends of the resonator holes, where the coating of the holes connects to the coating of the block, is not shown. The substrate S is mainly coated with a conductive material except for that part of the surface onto which the conductive patterns are formed, visible in the picture. Coupling strip GND is connected to the coating of the substrate S and thus to the coating of the block B, in other words, it serves as a ground plane. In FIG. 9, the other components of FIG. 4b, except for the resonators, are formed by transmission lines (darkened areas) and separate components CS1, CS2 and CS3 (e.g. surface mounted components). The coupling patterns for resonators R1, R2, R3 are located between the resonator block B and the substrate S and are therefore not seen in FIG. 9. The coupling patterns can be formed in the manner described in the Finnish Patent No. 86637. All conductive patterns and components formed on the substrate S could also be formed on a side surface of the ceramic block B.

FIG. 10a illustrates according to the invention the implementation of the circuit shown in FIG. 6a in a dielectric filter the construction of which is, in broad outline, similar to that of the filter shown in FIG. 9. Transmission lines L1 to L5 of FIG. 6a are not separately shown in FIG. 10a but they are included in stripline 27 between the resonators. Transmission lines L10, L11 and L12 implemented with stripline technology are open quarter-wave-long transmission line stubs. As the transmission lines are open circuits at a harmonic of the fundamental frequency, say, at the third multiple frequency, their combined effect at the harmonic of the fundamental frequency is a short circuit from stripline 27 to the ground potential. Connection of stubs L10, L11 and L12 to a common transmission line resonator filter strip 27 produces between the filter input port IN and output port OUT a great attenuation at the desired harmonic and a small insertion loss at the fundamental frequency. In addition to the harmonics, also other undesired frequencies can be chosen to be attenuated by making the stripline stubs L10 to L12 varying in length and by connecting them to different locations of stripline 27. Filter constructions operating at different frequencies can be integrated to different transmission line constructions of the transmission line resonator filter to attenuate several different harmonics and spurious frequencies.

FIG. 10b illustrates according to the invention the realization of the circuit in FIG. 6b in a dielectric filter the construction of which is, in broad outline, similar to that of the filter shown in FIG. 9. The harmonic attenuation filter is implemented with stripline stubs L13, L14 and L15 which are at their upper end capacitively coupled through a gap to stripline 31 in the ceramic resonator filter. At the lower end, the stubs are capacitively coupled through a gap to a ground plane GND at the bottom of the substrate, thereby making possible to reduce the mechanical length of the stubs. Stubs L13, L14 and L15 and the corresponding section of stripline 31 constitute a known π-type low pass construction which can be used to attenuate undesired frequencies above a certain threshold frequency.

FIG. 10c illustrates according to the invention the realization of th e circuit in FIG. 6c in a dielectric filter the construction of which is, in broad outline, similar to that of the filter shown in FIG. 9. The harmonic attenuation filter is implemented with stripline stubs L16, L17, L18 and L19 which are at their upper end coupled to stripline 37 included in the ceramic resonator filter. At the lower end the stubs are open, thereby constituting quarter-wave-long transmission line resonators. The construction comprising stubs L16, L17, L18 and L19 can be used to attenuate undesired frequencies in the same way as the construction comprising stubs L10, L11 and L12 shown in FIG. 10a.

FIG. 10d shows other known harmonic attenuation filter constructions which are applicable according to the invention and which are used in separate low pass filters. The striplines constituting the harmonic attenuation filter can be formed, as stripline L48, on the uncoated side of the ceramic block, as disclosed in the Finnish Patent No. 88440. The stripline resonators can also be formed, as stripline L47, on the substrate S without a galvanic contact to the other conductive structures in the filter, thereby making the coupling to the transmission line resonators occur through a dielectric medium via an electromagnetic field. It is obvious to one skilled in the art that other known types of filter constructions can be made part of the transmission line resonator filter according to the invention and that the invention is in no way limited to the embodiments illustrated. The ceramic resonators may be separate blocks B1, B2, B3 which are connected together to form a ceramic resonator filter.

Above it was described how a harmonic filter can be integrated according to the invention to a band rejection filter (BRF), referring to equivalent circuits 6a to 6c and embodiments 8a to 10d of the integrated construction. Next it will be described how a harmonic filter can be integrated according to the invention to a band pass filter (BPF), referring to FIGS. 7a to 7c and 11a to 11c.

FIG. 11a illustrates according to the invention the realization of the circuit in FIG. 7a in a dielectric filter the construction of which is, in broad outline, similar to that of the filter shown in FIG. 9. The harmonic attenuation filter is implemented with stripline stubs L23 and L24, which are at one end connected to stripline L9 included in the ceramic resonator filter. At the lower end, the stubs L23 and L24 are open and their length is one quarter of the wavelength of the harmonic to be attenuated and thus they constitute a quarter-wave transmission line resonator at the harmonic frequency, effectively attenuating the frequency in question. Furthermore, capacitors C18 and C19 and stripline L9 constitute a known π-type low pass construction used in addition to the stripline resonators L23 and L24 for attenuating the harmonics.

FIG. 11b illustrates according to the invention the realization of the circuit in FIG. 7b in a helix filter. The implementation of the helix resonator filter is, in broad outline, similar to that seen in FIG. 8a, but couplings from one helix resonator to another are realized capacitively by means of coupling holes 51 and 52 formed in the partitions of the filter casing 50. Capacitors C17, C18 and C19 of FIG. 7b are not shown in FIG. 11b but they are to be added to the filter of FIG. 11b as surface mounted components soldered to coupling pads 1, 4 and 5. The harmonic attenuation filter is implemented with stripline stubs L25, L26 and L27 which are at their upper end capacitively coupled through a gap to stripline L6 in the helix resonator filter. At the lower end, the stubs are capacitively coupled through a gap to a ground plane (not shown) at the bottom of the insulating plate, thereby making possible to reduce the mechanical length of the stubs. Stubs L25, L26 and L27 and the corresponding section of stripline 6 constitute a known π-type low pass constriction which can be used to attenuate undesired frequencies above a certain threshold frequency.

FIG. 11c illustrates according to the invention the realization of the circuit in FIG. 7c in a dielectric filter the construction of which is, in broad outline, similar to that of the filter shown in FIG. 9. The harmonic attenuation filter is implemented with stripline stubs L29 to L32, which are at one end connected to stripline L28 included in the ceramic resonator filter. At the lower end, the stubs L29 to L32 are open and they attenuate harmonics in the same way as striplines L23 and L24 in the filter shown in FIGS. 7a and 11a. The filter of FIGS. 7c and 11c also has attenuating stripline constructions L33 and L34 similar to said striplines L23 and L24 in the filter of FIGS. 7a and 11a. Furthermore, capacitors C18 and C19 and stripline L9 constitute a known π-type low pass construction used in addition to the stripline resonators to attenuate the harmonics.

It is obvious to one skilled in the art that in addition to the constructions shown in FIGS. 11a to 11c, other known types of filter constructions can be made part of the band-pass-type transmission line resonator filter according to the invention and that the invention is in no way limited to the embodiments illustrated. The ceramic resonators of the dielectric filter may also be separate blocks B1, B2, B3, as in FIG. 10d, which are connected together to form a ceramic resonator filter. In general, a filter to which the harmonic attenuation elements according to the invention are added, may also be based on stripline resonators, for example.

The integrated construction according to the invention, comprising a transmission line resonator filter and a harmonic attenuation filter, can significantly reduce losses caused by a separate harmonic filter, improve the harmonic filtering and make the design of the filter simpler. Furthermore, the good insulating and filtering characteristics of the traditional duplex filter can be preserved, even though the volume of the radio transceiver apparatus and the surface area required by the apparatus on a telephone PCB are reduced. In addition, the number of components inserted on the PCB is reduced, as compared to the arrangement with separate filters, which reduces manufacturing costs. The filter needs no extra components other than the striplines described above which are formed on the substrate belonging to the transmission line resonator construction at the same time with the other stripline structures of the filter.

The present invention is not restricted to any particular filter technology or application but can be used in various applications, with different filtering techniques and at different frequencies, advantageously radio frequencies, such as UHF and VHF.

We claim:

1. An integrated radio frequency filter and harmonic filter comprising:

an input port, an output port, at least one transmission line resonator having a certain operating frequency band, and a coupling circuit disposed between said input port and said output port to couple radio frequency power between said input port and said output port and said transmission line resonators, the integrated radio frequency filter and harmonic filter further comprising:

an attenuating circuit disposed between said input port and said output port to attenuate frequency components of particular frequency bands outside said operating frequency band and comprising strip conductors having electrical lengths which are predetermined fractions of a wavelength of a harmonic of said operating frequency band, said coupling circuit and said attenuating circuit having at least one common element.

2. The radio frequency filter of claim 1, wherein said transmission line resonators include helix resonators.

3. The radio frequency filter of claim 1, wherein said coupling circuit comprises matching couplings, said strip conductors being connected via an electromagnetic field to said matching couplings.

4. The radio frequency filter of claim 3, wherein said matching couplings comprise a transmission line and each of said strip conductors comprises a first end and a second end, the first end being capacitively coupled to said transmission line.

5. The radio frequency filter of claim 3, wherein said matching couplings comprise a transmission line and said conductors form a series of substantially straight strip elements, where a first element is capacitively coupled to said transmission line and each following element is capacitively coupled to a preceding element.

6. The radio frequency filter of claim 3, wherein said matching couplings comprise a transmission line and said strip conductor form a series of substantially U-shaped strip elements;, where each element is capacitively coupled to said transmission line and to adjacent elements of said series.

7. The radio frequency filter of claim 1, wherein said transmission line resonators include dielectric resonators.

8. The radio frequency filter of any one of the preceding claims, wherein said coupling circuit comprises matching couplings, said strip conductors being in galvanic contact with said matching couplings.

9. The radio frequency filter of claim 8, wherein said matching couplings comprise a transmission line and each of said strip conductors comprises a first end and a second end, the first end being in galvanic contact with said transmission line.

10. The radio frequency filter of any one of claims 1 to 7, wherein coupling to said attenuating circuit occurs through an electromagnetic field of said transmission line resonators.

* * * * *